(12) United States Patent
Brannam et al.

(10) Patent No.: US 7,023,974 B1
(45) Date of Patent: Apr. 4, 2006

(54) COMPRESSION OF ELECTRONIC COMMUNICATIONS

(75) Inventors: Todd Brannam, Alexandria, VA (US); Marc A. Katchay, Silver Spring, MD (US); Gregory Puhak, Sterling, VA (US)

(73) Assignee: America Online, Inc., Dulles, VA (US)

( * ) Notice: Subject to any disclaimer, the term of this patent is extended or adjusted under 35 U.S.C. 154(b) by 253 days.

(21) Appl. No.: 10/284,469

(22) Filed: Oct. 31, 2002

(51) Int. Cl.
*H04M 11/00* (2006.01)

(52) U.S. Cl. .............................. 379/93.24; 379/90.01; 379/88.17; 709/206

(58) Field of Classification Search ............. 379/93.24, 379/90.01, 93.05, 88.13, 88.17, 88.22; 709/206, 709/247, 203, 238
See application file for complete search history.

(56) References Cited

U.S. PATENT DOCUMENTS

| 6,460,044 | B1 | 10/2002 | Wang |
| 6,493,107 | B1 | 12/2002 | Toyoda et al. |
| 6,728,785 | B1* | 4/2004 | Jungck ........................ 709/247 |
| 2003/0028606 | A1* | 2/2003 | Koopmans et al. ......... 709/206 |

FOREIGN PATENT DOCUMENTS

| JP | 411187235 A | * | 7/1999 |
| JP | 2000-261493 | * | 9/2000 |
| JP | 02001125851 A | * | 5/2001 |
| JP | 02001167158 A | * | 6/2001 |

* cited by examiner

*Primary Examiner*—Melur Ramakrishnaiah
(74) *Attorney, Agent, or Firm*—Fish & Richardson P.C.

(57) ABSTRACT

A computer system includes a detection processing module for determining whether a remote system associated with the destination of an electronic communication is capable of decompressing a compressed portion of the electronic communication. The computer system also includes a compression processing module for compressing a portion of an electronic communication if the remote system is determined capable of decompressing the compressed portion. The computer system also includes a communication processing module for sending the compressed portion of the electronic communication to the remote system.

48 Claims, 13 Drawing Sheets

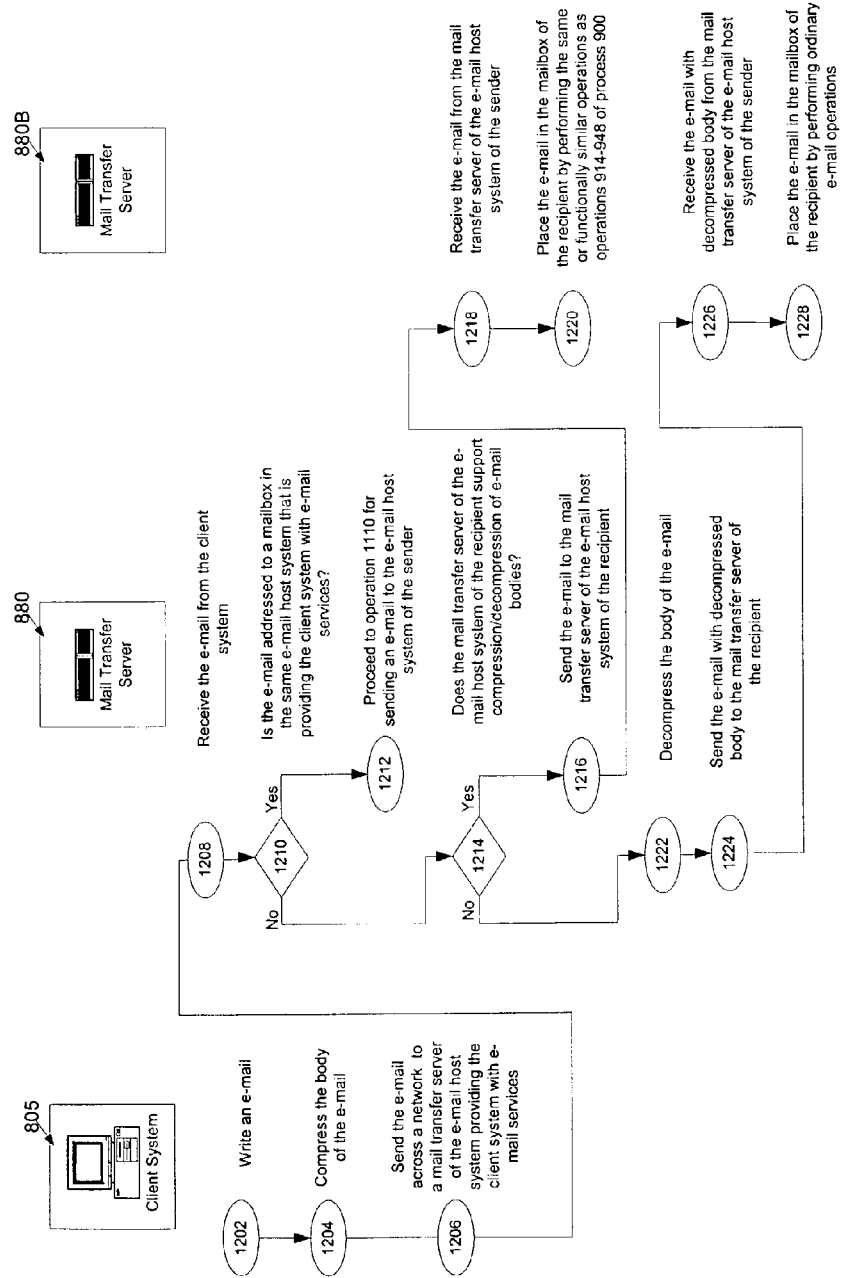

COMPRESSION OF ELECTRONIC COMMUNICATIONS

TECHNICAL FIELD

This description relates to compression of digital data, and more particularly to compression of portions of electronic communications.

BACKGROUND

Compression of data may be used to limit the amount of storage space required to store data and the amount of network bandwidth required to transport data. Compression standards and formats may vary depending on the type of data that is being compressed. Examples of graphics data compression standards include Joint Photographic Experts Group (JPEG) and Graphics Interchange Format (GIF). Examples of video data compression standards include the Motion Pictures Experts Group (MPEG) standards (e.g. MPEG-1, MPEG-2, and MPEG-4). An example of an audio data compression standard is MPEG audio layer 3 (MP-3). Common compression formats for general data files include ZIP and ARC.

SUMMARY

In one general aspect, a computer system includes a detection processing module for determining whether a remote system associated with the destination of an electronic communication is capable of decompressing a compressed portion of the electronic communication. The computer system also includes a compression processing module for compressing a portion of an electronic communication if the remote system is determined capable of decompressing the compressed portion. The computer system also includes a communication processing module for sending the compressed portion of the electronic communication to the remote system.

Implementations may include one or more of the following features. For example, the electronic communication may include encoded text. The compression may be lossless. The compression processing module may use a Zlib compression scheme.

The communication may be an e-mail. The portion may be a body of the e-mail which may include contents written in hypertext markup language. The portion may be one or more attachments to the e-mail or an image imbedded in the e-mail.

The compression processing module may be capable of compressing an attachment to the e-mail or an image embedded in the e-mail if the remote system is determined capable of decompressing. The compression processing module may be capable of sending the compressed attachment to the e-mail or compressed image embedded in the e-mail to the remote system.

In another general aspect, sending an electronic communication includes determining whether a remote system associated with the destination of an electronic communication is capable of decompressing a compressed portion of the electronic communication. Sending the electronic communication also includes compressing a portion of an electronic communication if the remote system is determined capable of decompressing the compressed portion and sending the compressed portion to the remote system.

In another general aspect, a computer system includes a detection processing module for determining whether a remote system associated with the origin of a communication is capable of compressing a portion of the electronic communication. The computer system also includes a compression processing module for decompressing a portion of an electronic communication if the remote system is determined capable of compressing the portion. The computer system also includes a communication processing module for receiving the compressed portion of the electronic communication from the remote system.

Implementations may include one or more of the following features. For example, the electronic communication may include encoded text. The compression may be lossless. The compression processing module may use a Zlib compression scheme.

The communication may be an e-mail. The portion may be a body of the e-mail which may include contents written in hypertext markup language. The portion may be one or more attachments to the e-mail or an image imbedded in the e-mail.

The compression processing module may be capable of decompressing a compressed attachment to the e-mail or a compressed image embedded in the e-mail if the remote system is determined capable of compressing. The compression processing module may be capable of receiving the compressed attachment to the e-mail or compressed image embedded in the e-mail from the remote system.

In another general aspect, receiving an electronic communication includes determining whether a remote system associated with the origin of an electronic communication is capable of compressing a portion of the electronic communication. Receiving the electronic communication also includes receiving a compressed portion of an electronic communication from the remote system and decompressing the compressed portion if the remote system is determined capable of compressing the portion.

The details of one or more implementations of the invention are set forth in the accompanying drawings and the description below. Other features will be apparent from the description and drawings, and from the claims.

DESCRIPTION OF DRAWINGS

FIG. 12 is a flow diagram of a process for enabling a user to send an e-mail with a compressed body to a recipient having a mailbox in an e-mail host system different from that used by the sender.

Like reference symbols in the various drawings indicate like elements. For brevity, several elements in the figures described below are represented as monolithic entities. However, as would be understood by one skilled in the art, these elements each may include numerous interconnected computers and components designed to perform a set of specified operations and/or dedicated to a particular geographical region.

DETAILED DESCRIPTION

Compression of electronic communications exchanged between two computer systems connected through a network is desirable to limit the amount of storage space required to store the communications and the amount of network bandwidth required to transport the communications. A communication may be entirely compressed or, alternatively, a portion of the communication may be compressed.

A communications system configured to process and handle partially or fully compressed communications includes a client system and a host system capable of exchanging and delivering electronic data across a network and performing additional compression/decompression functions. The communications system may include logic to determine and distinguish among the compression schemes available or preset at the host system and the client system. This logic may be particularly useful in an environment where the client system may have diverse compression capabilities or none at all.

The client system may be able to perform one or more of the following functions: compress all or a portion of a communication prior to sending the communication; detect when a communication that is partially or completely compressed is received; and partially or completely decompress the received communication.

The host system may be able to perform one or more of the following functions: detect when a communication including a compressed portion is received; decompress one or more of the compressed portions of the communication; detect when another client system and/or another host system has the capability of processing communications with compressed portions; and selectively compress portions of communications that are addressed to client systems and/or host systems able to process communications with compressed portions.

An implementation of the communications system tailored specifically to the exchange and compression of e-mails includes a client system and a host system able to compress and decompress different portions of an e-mail, including the e-mail body. Compression of e-mail bodies promises to offer increasingly significant bandwidth and storage savings as the use of bulky hypertext markup language (HTML) formatted text in e-mail bodies becomes increasingly common.

Figure 1:
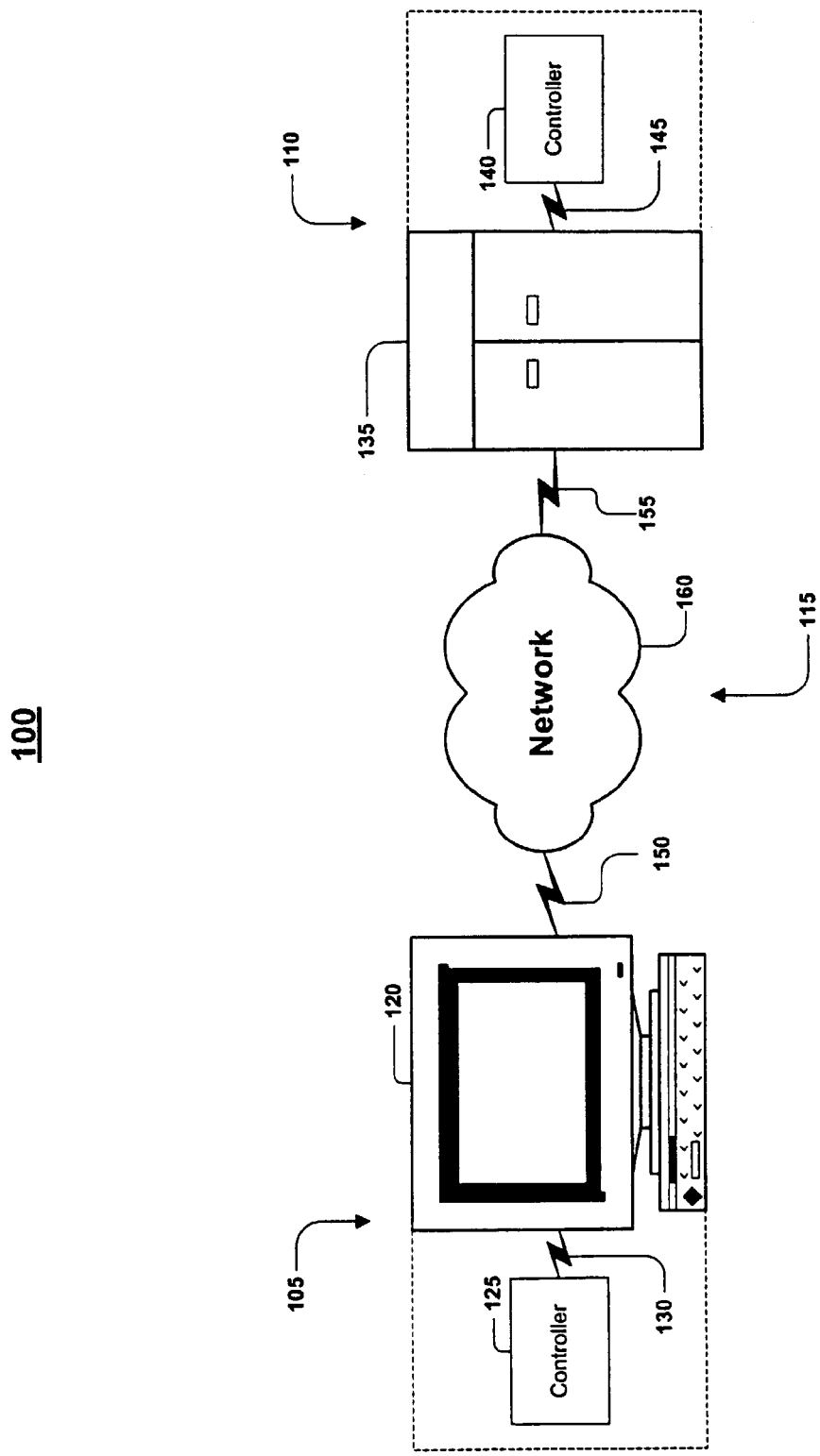
FIG. 1 is a block diagram of a communications system.
Figure 2:
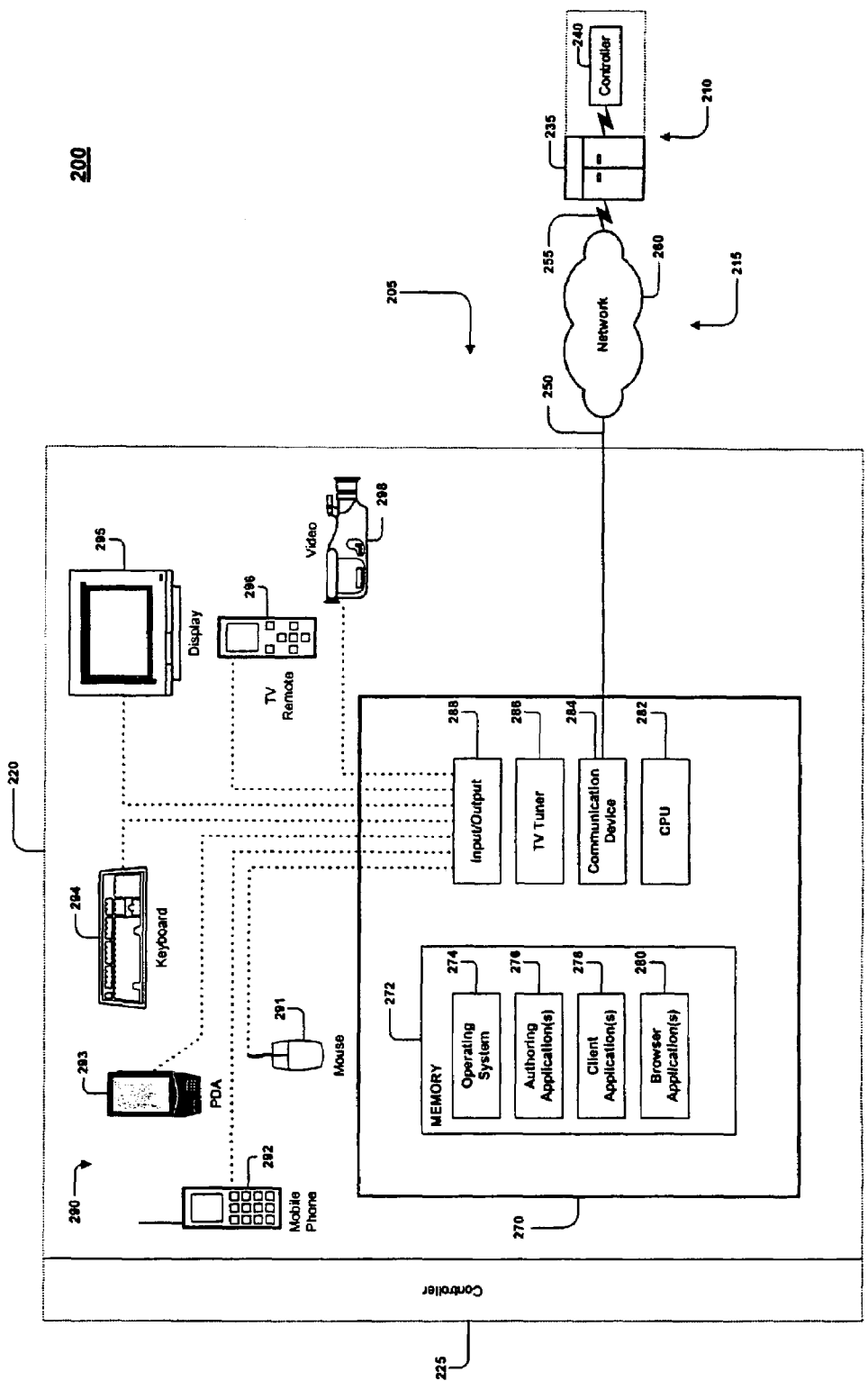
FIG. 2 is an expansion of the block diagram of FIG. 1.

For illustrative purposes, FIGS. 1 and 2 describe a communications system that implements techniques for transferring electronic data.

Referring to FIG. 1, a communications system 100 is capable of delivering and exchanging data between a client system 105 and a host system 110 through a communications link 115. The client system 105 typically includes one or more client devices 120 and/or client controllers 125, and the host system 110 typically includes one or more host devices 135 and/or host controllers 140. For example, the client system 105 or the host system 110 may include one or more general-purpose computers (e.g., personal computers), one or more special-purpose computers (e.g., devices specifically programmed to communicate with each other and/or the client system 105 or the host system 110), or a combination of one or more general-purpose computers and one or more special-purpose computers. The client system 105 and the host system 110 may be arranged to operate within or in concert with one or more other systems, such as, for example, one or more LANs ("Local Area Networks") and/or one or more WANs ("Wide Area Networks").

The client device 120 (or the host device 135) is generally capable of executing instructions under the command of a client controller 125 (or a host controller 140). The client device 120 (or the host device 135) is connected to the client controller 125 (or the host controller 140) by a wired or wireless data pathway 130 (or pathway 145) capable of delivering data.

The client device 120, the client controller 125, the host device 135, and the host controller 140 each typically include one or more hardware components and/or software components. An example of a client device 120 or a host device 135 is a general-purpose computer (e.g., a personal computer) capable of responding to and executing instructions in a defined manner. Other examples include a special-purpose computer, a workstation, a server, a device, a component, other physical or virtual equipment or some combination thereof capable of responding to and executing instructions.

An example of client controller 125 or a host controller 140 is a software application loaded on the client device 120 or the host device 135 for commanding and directing communications enabled by the client device 120 or the host device 135. Other examples include a program, a piece of code, an instruction, a device, a computer, a computer system, or a combination thereof, for independently or collectively instructing the client device 120 or the host device 135 to interact and operate as described. The client controller 125 and the host controller 140 may be embodied permanently or temporarily in any type of machine, component, physical or virtual equipment, storage medium, or propagated signal capable of providing instructions to the client device 120 or the host device 135.

The communications link 115 typically includes a delivery network 160 capable of enabling direct or indirect communication between the client system 105 and the host system 110, irrespective of physical separation. Examples of a delivery network 160 include the Internet, the World Wide Web, WANs, LANs, analog or digital wired and wireless telephone networks (e.g., Public Switched Telephone Network (PSTN), Integrated Services Digital Network (ISDN), and Digital Subscriber Line (xDSL)), radio, television, cable, satellite, and/or any other delivery or tunneling mechanism for carrying data. The communications link 115 may include communication pathways 150 and 155 that enable communications through the one or more delivery networks 160 described above. Each of the communication pathways 150 and 155 may include, for example, a wired, wireless, cable or satellite communication pathway.

FIG. 2 illustrates a communication system 200 including a client system 205 communicating with a host system 210 through a communications link 215. Client system 205 typically includes one or more client devices 220 and one or more client controllers 225 for controlling the client devices 220. Host system 210 typically includes one or more host devices 235 and one or more host controllers 240 for controlling the host devices 235. The communications link 215 may include communication pathways 250 and 255 that enable communications through the one or more delivery networks 260.

Examples of each element within the communication system 200 of FIG. 2 are broadly described above with respect to FIG. 1. In particular, the host system 210 and the communications link 215 typically have attributes comparable to those described with respect to the host system 110 and the communications link 115 of FIG. 1, respectively. Likewise, the client system 205 of FIG. 2 typically has attributes comparable to and may illustrate one possible implementation of the client system 105 of FIG. 1.

The client device 220 typically includes a general purpose computer 270 having an internal or external storage 272 for storing data and programs such as an operating system 274 (e.g., DOS, Windows™, Windows 95™, Windows 98™, Windows 2000™, Windows NT™, Windows ME™, Windows XP™, OS/2, Mac OS X, Unix, and Linux) and one or more application programs. Examples of application programs include authoring applications 276 (e.g., word processing programs, database programs, spreadsheet programs, and graphics programs) capable of generating documents or other electronic content; client applications 278 (e.g., AOL client, CompuServe client, AIM client, AOL TV client, and ISP client) capable of communicating with other computer users, accessing various computer resources, and viewing, creating, or otherwise manipulating electronic content; and browser applications 280 (e.g., Netscape's Navigator and Microsoft's Internet Explorer) capable of rendering content such as standard Internet content and email content. Other examples of application programs may include, for example, a Point-to-Point Protocol (PPP) client, a User Datagram Protocol (UDP) client, a Point-to-Point Protocol over Ethernet (PPPoE) client, and a Layer Two Tunneling Protocol (L2TP) client, which may be included as a client application 278 or may be a separate application program used to support other application programs, such as the client applications 278 and the browser applications 280.

The general-purpose computer 270 also includes a central processing unit 282 (CPU) for executing instructions in response to commands from the client controller 225. In one implementation, the CPU 282 executes instructions included in one or more of the application programs installed on the internal or external storage 272 of the general-purpose computer 270. In another implementation, the CPU 282 executes instructions included in application programs externally stored in and executed by one or more device(s) external to the general-purpose computer 270.

The general-purpose computer 270 also includes a communication device 284 for sending and receiving data. One example of the communication device 284 is a modem, such as a DSL modem, a cable modem, or a satellite modem. Other examples include, a transceiver, a set-top box, a communication card, a satellite dish, an antenna, or another network adapter capable of transmitting and receiving data over the communications link 215 through a wired or wireless data pathway 250. The general-purpose computer 270 also may include a TV ("television") tuner 286 for receiving TV programming in the form of broadcast, satellite, and/or cable TV signals. As a result, the client device 220 can selectively and/or simultaneously display network content received by communications device 284 and television programming content received by the TV tuner 286.

The general-purpose computer 270 also includes an input/output interface 288 to enable a wired or wireless connection to various peripheral devices 290. Examples of peripheral devices 290 include, but are not limited to, a mouse 291, a mobile phone 292, a personal digital assistant 293 (PDA), a keyboard 294, a display monitor 295 with or without a touch screen input, a TV remote control 296 for receiving information from and rendering information to subscribers, and/or an audiovisual input device 298. Other examples may include voice recognition and synthesis devices (not shown).

Although FIG. 2 illustrates devices, such as a mobile telephone 292, a PDA 293, and a TV remote control 296, as being peripheral with respect to the general-purpose computer 270, in another implementation, such devices may themselves include the functionality of the general-purpose computer 270 and operate as the client device 220. For example, the mobile phone 292 or the PDA 293 may include computing and networking capabilities, and may function as a client device 220 by accessing the delivery network 260 and communicating with the host system 210. Furthermore, the client system 205 may include one, some or all of the components and devices described above.

The electronic communications delivered and exchanged between the client system 105 or 205 and the host system 110 or 210 may be compressed, decreasing the amount of storage space required to store the communications and the amount of network bandwidth required to transport the communications. The data delivered and exchanged between the client system 105 or 205 and the host system 110 or 210 may include any electronic communications data including, but not limited to, instant messages, electronic mail (e-mail), audio, video, or other general binary data or encoded text data (e.g., text data stored in American Standard Code for Information Interchange (ASCII) format). The utility of compression and the amount of storage and bandwidth savings vary depending on the type of communications data. The client system 105 or 205 and the host system 110 or 210 may both be capable of compressing and decompressing all or a portion of a communication transferred between the client system 105 or 205 and the host system 110 or 210.

The discussion below makes reference to the client system 205 and the host system 210. However, the techniques and processes discussed below are equally applicable to the client system 105 and the host system 110.

Figure 3B:
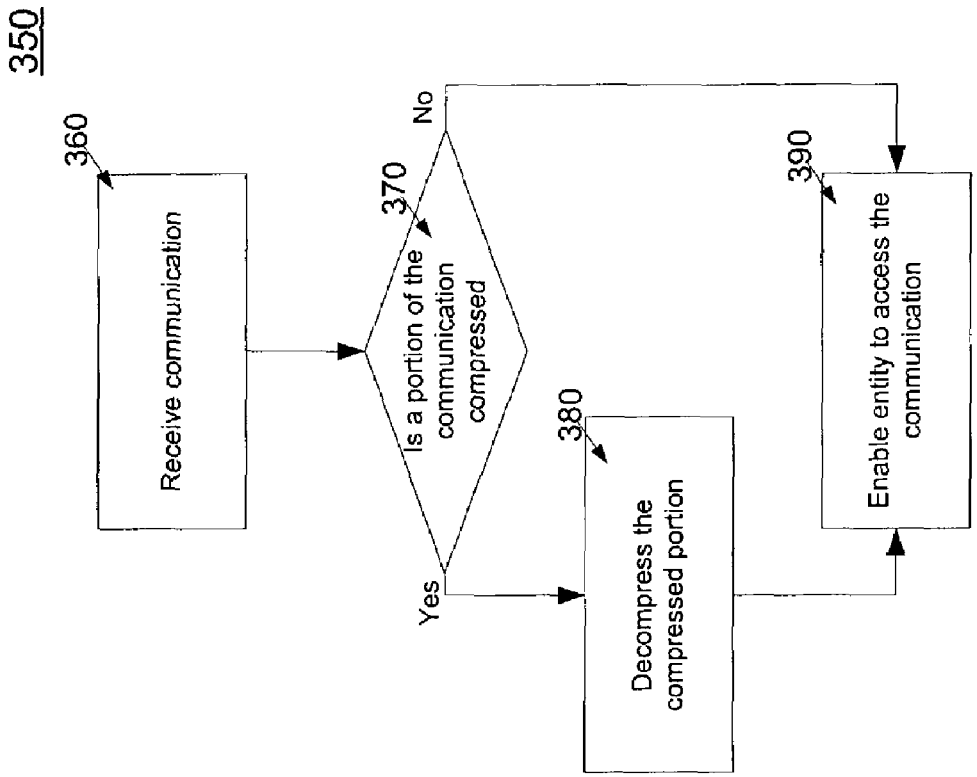
FIGS. 3A and 3B are flow diagrams of processes used by a client system for, respectively, sending and receiving communications that include compressed portions.
Figure 3A:
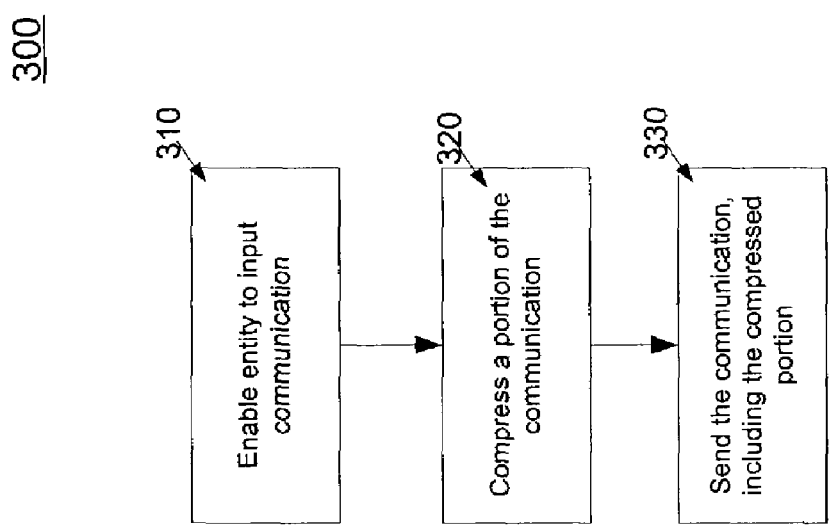

Referring to FIG. 3A, a process 300 may be used by the client system 105 or 205 for sending communications including compressed portions to recipients. The process 300 includes enabling an entity, such as a user, to input a communication at the client system (310); compressing a portion of the communication (320); and sending the communication including the compressed portion to another system (330). In one implementation, the communication is sent to a host system 110 or 210 that is providing communications services to the specific client system 105 or 205 (i.e., the client system 105 or 205 is registered to receive communications services from the host system 110 or 210).

Referring to FIG. 3B, a process 350 may be used by the client system 105 or 205 for receiving communications that include compressed portions. The process 350 includes receiving the communication (360), determining if a portion of the communication is compressed (370), decompressing one or more of the compressed portions of the communication (380), and enabling an entity, such as a user, to access the communication (390). In one implementation, the communication is received from the host system 110 or 210 that is providing communications services to the client system 105 or 205.

Figure 4A:
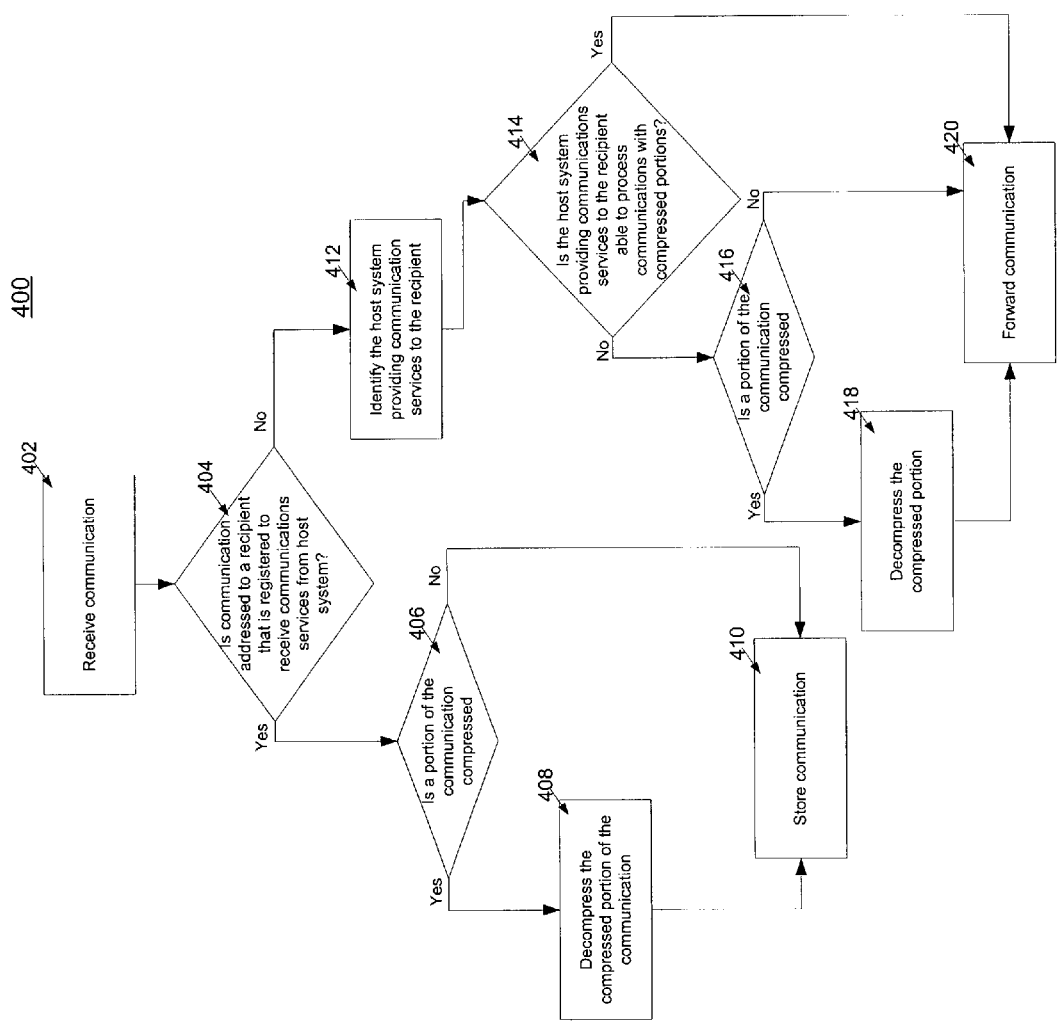
FIG. 4A is a flow diagram of a process used by a host system for receiving and storing communications that include compressed portions.

Referring to FIG. 4A, a process 400 may be used by the host system 110 or 210 for receiving communications that include compressed portions. The process 400 includes receiving the communication (402) and determining if the communication is addressed to a recipient registered by the host system 110 or 210 (404). If the recipient is registered by the host system 110 or 210, the host system 110 or 210 examines the communication and determines whether a portion of the communication is compressed (406). If a portion of the communication is compressed, the host system decompresses one or more of the compressed portions (408) prior to storing the communication in a storage location accessible to the recipient (410). The host system 110 or 210 may optionally recompress the communication prior to storage in order to conserve storage space.

In some implementations, the host system 110 or 210 may examine the communication to determine whether one or more portions of the communication are compressed using a preferred compression scheme. If one or more portions are compressed using a preferred compression scheme, the host system 110 or 210 may immediately store the compressed portions rather than decompress the compressed portions (i.e., the host system 110 or 210 skips operation 408) prior to storage. In other implementations, the host system 110 or 210 may skip operations 406 and 408 entirely and store the communication without ever examining whether a portion of the communication is compressed.

If the recipient of the communication is not registered to receive communications services from the host system 110 or 210, the host system 110 or 210 identifies a second and different host system (not shown) that is providing the client system 105 or 205 with communications services (412). The host system 110 or 210 determines whether the second host system is able to process communications with compressed portions (414). If the second host system is not able to process communications with compressed portions, the host system 110 or 210 determines whether the communication has a compressed portion (416) and decompresses any such compressed portions (418), and forwards the uncompressed communication to the second host system (420). If the second host system is able to process communications with compressed portions, the host system 110 or 210 may not examine the communication and may simply forward the communication to the second host system, regardless of whether all or a portion of the communication is compressed (420).

In some implementations, the host system 110 or 210 may determine whether the second host system is able to process communications compressed using a preferred compression scheme. If the second host system is able to process communications compressed using a preferred compression scheme and the received communication is compressed using the preferred compression scheme, the host system 110 or 210 may forward the communication to the second host system directly without any decompression. However, if the second host system is able to process communications compressed using a preferred compression scheme and the received communication is compressed using a different compression scheme, the host system 110 or 210 may decompress all or portions of the communication and then recompress all or portions of the communication using the preferred compression scheme prior to forwarding the communication to the second host system. If the second host system is able to process communications compressed using a preferred compression scheme and the received communication is not compressed, the host system 110 or 210 may compress all or portions of the communication using the preferred compression scheme prior to forwarding the communication to the second host system. In other implementations, the host system 110 or 210 may skip operations 414, 416, and 418 entirely and forward the communication without examining whether the second host system is able to process a communication with compressed portions and without determining whether a portion of the communication is compressed.

Figure 4B:
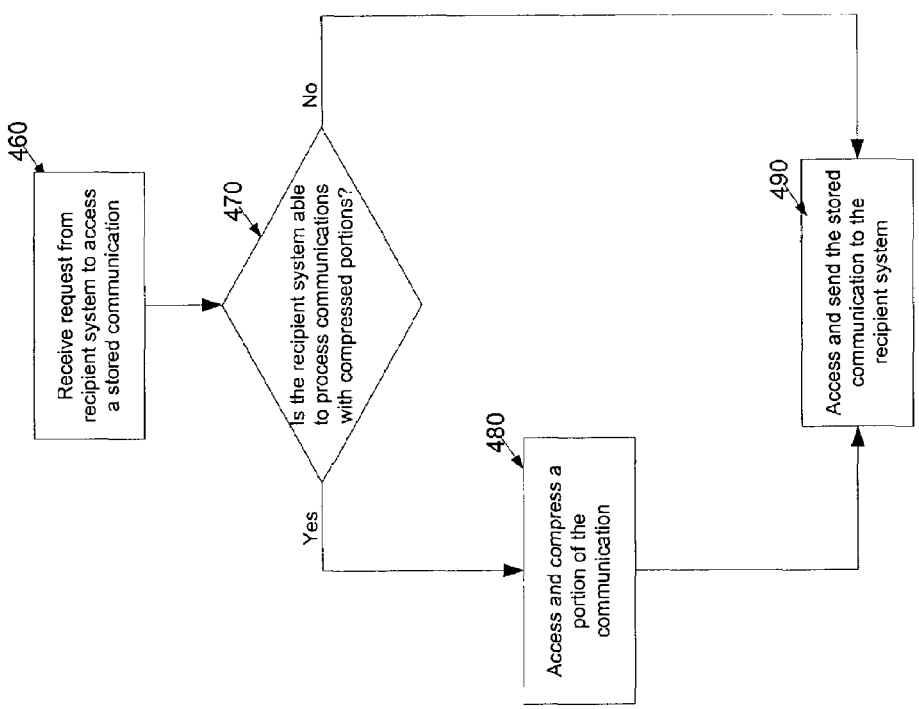
FIG. 4B is a flow diagram of a process used by a host system for enabling a client system to access received communications that include compressed portions.

Referring to FIG. 4B, a process 450 used by the host system 110 or 210 for enabling a client system 105 or 205 (i.e., the recipient system) to access a received communication with one or more compressed portions includes receiving a request from the recipient system to access a stored received communication (460) and determining whether the recipient system is able to process communications with compressed portions (470). For instance, the host system 110 or 210 may determine whether the recipient system is able to process communications with compressed portions by, for example, using a lookup table, exchanging information with or soliciting information from the recipient system, or by using test communications. If the recipient system is able to process communications with compressed portions, the stored communication is accessed and one or more portions of the communication are compressed (480). Regardless of whether all or some portion of the stored communication is compressed, the stored communication is accessed and all or some portion of the communication is sent to the recipient system (490).

Figure 5:
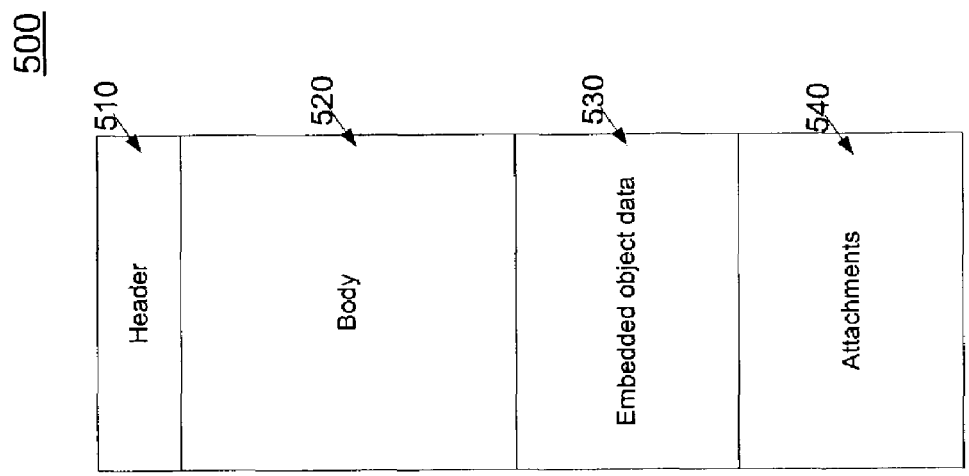
FIG. 5 is a block diagram of an exemplary e-mail.

Referring to FIG. 5, a communication that may be exchanged between host system 110 or 210 and client system 105 or 205 is an e-mail 500. The e-mail 500 may be an encoded text file that includes a header 510 and one or more of a body 520, embedded object data 530, and attachments 540. The e-mail header 510 typically includes a name or address of the sender of the e-mail, a name or address of the recipient of the e-mail, a date and a time that the e-mail was sent, and a subject to which the e-mail relates. The e-mail header 510 also may include information relating to the path taken by the e-mail to arrive at its destination and the name of the e-mail application used to generate the e-mail.

The e-mail body 520 includes the contents or the message text of the e-mail and may include, for example, text provided by the user that generated the e-mail. The e-mail body 520 typically is stored directly as encoded text. The e-mail body 520 may include encoded text formatted as hypertext transfer markup language (HTML) that may be accessed and displayed using, for example, an HTML-compatible e-mail application.

The embedded object data 530 may include data, such as graphics data, included in the e-mail body 520 that may be displayed or otherwise used along with the e-mail body 520 when a user accesses or opens the e-mail using the e-mail application. The embedded object data 530 may be converted into encoded text (e.g., ASCII text) using an encoding scheme such as, for example, multipurpose Internet mail extensions (MIME) or Unix-to-Unix encode (Uuencode).

The e-mail attachments 540 typically include one or more files that are attached to the e-mail. The attachments may be encoded text files, formatted text files (e.g., Microsoft Word documents), or binary files (e.g., graphics files). Formatted text files and binary files may be converted into encoded text using, for example, MIME or Uuencode. The difference between the embedded object data 530 and the attachments 540 may be simply a matter of labeling.

Portions or all of the e-mail 500 may be compressed (i.e., converted into a more compact format) prior to delivery to decrease the amount of memory space required to store the e-mail 500 and the amount of network bandwidth required to transport the e-mail 500.

Figure 6:
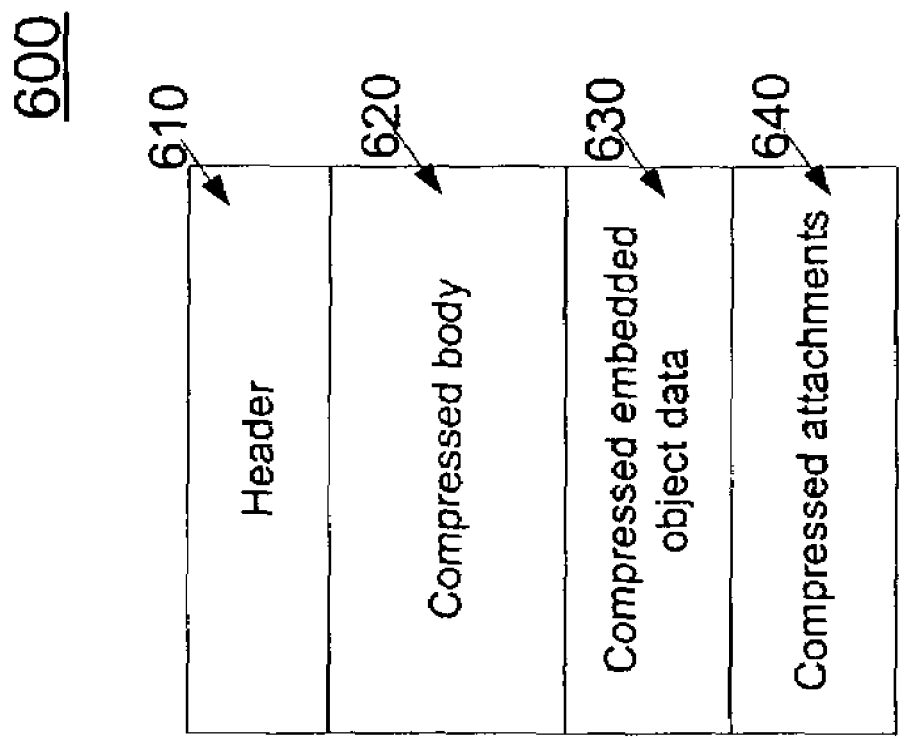
FIG. 6 is a block diagram of an exemplary compressed e-mail.

Referring to FIG. 6, a compressed e-mail 600 includes a header 610 and one or more of a compressed body 620, compressed embedded object data 630, and compressed attachments 640.

The header 610 corresponds to the header 510 of FIG. 5. The header 610 is examined by the mail server or servers of the sender and the recipient in order to properly direct the e-mail to its destination. The header 610 typically is not compressed due to its small size, which minimizes or eliminates any storage or network bandwidth savings from compression.

The compressed body 620 corresponds to the body 520 of FIG. 5, but compressed using a compression protocol. Zlib is a lossless compression protocol or scheme that may be used, for example, to compress the body 520. The compressed body 620 requires less storage space to store and less network bandwidth to transport than the body 520. If the body 520 includes HTML text, the storage and network bandwidth savings due to compression may be substantial. The format of HTML text is particularly bulky because HTML text includes frequent repetition of words and regular use of empty space. Compression may be used to reduce or eliminate the word repetition and empty space, thereby resulting in substantial savings in bandwidth and storage.

The compressed embedded object data 630 are a compressed version of the embedded object data 530. Since the embedded object data 530 typically are graphics data, the data may be compressed using, for example, joint photographic experts group (JPEG) or graphics interchange format (GIF) compression. Once compressed, the graphics data are converted into encoded text using, for example, MIME or Uuencode.

The compressed attachments 640 correspond to the attachments 540, but are compressed using a file compression format such as, for example, ZIP or ARC. Once compressed, the attachment files are converted into encoded text using, for example, MIME or Uuencode.

Figure 7:
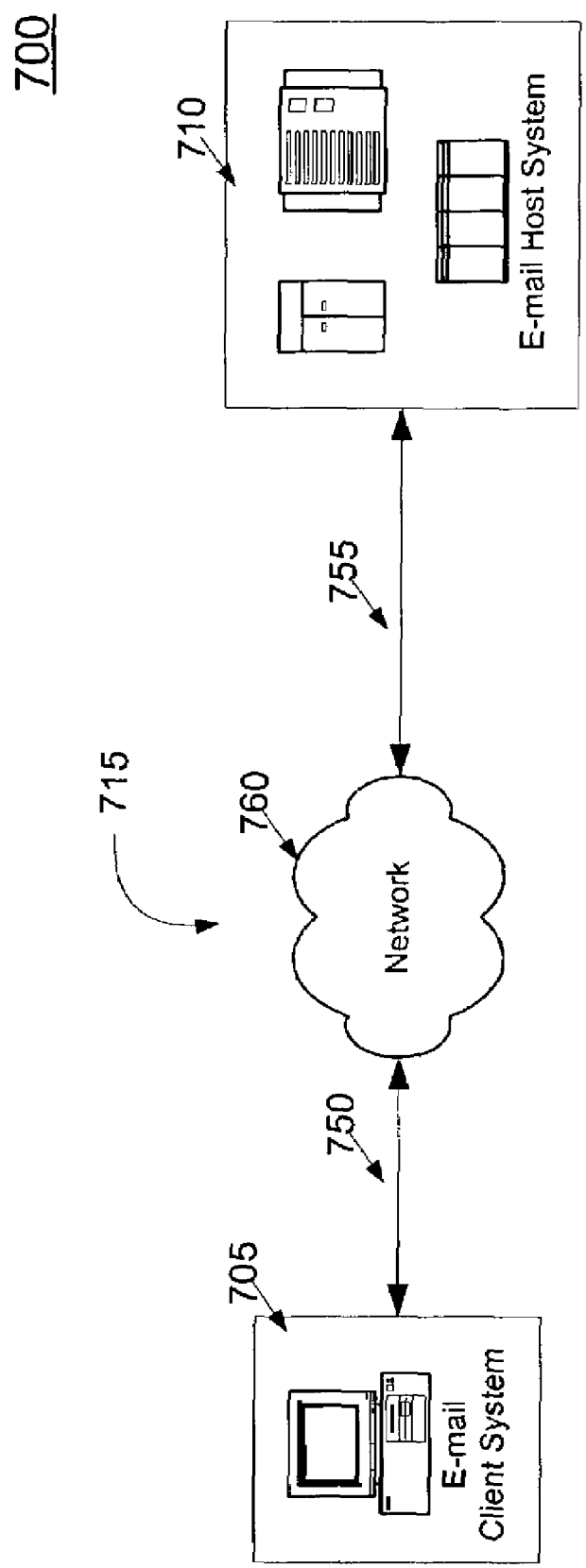
FIG. 7 is a block diagram of an e-mail communications system.

FIG. 7 illustrates an e-mail-oriented implementation 700 of the communications systems 100 and 200. The e-mail communications system 700 includes an e-mail client system 705 communicating with an e-mail host system 710 through a communications link 715. The communications link 715 may include communications pathways 750 and 755 that enable communications through the one or more delivery networks 760.

The e-mail client system 705 and the communications link 715 typically have attributes comparable to those described with respect to the client system 205 and the communications link 215 of FIG. 2. The e-mail client system 705 includes an e-mail application used to log into, send e-mails to, and receive e-mails from the e-mail host system 710.

The e-mail host system 710 provides e-mail services to a recognized user of the e-mail client system 705. These services include providing recognized users with the ability to compose and organize e-mails and the ability to send e-mails to and receive e-mails from other users across the one or more delivery networks 760.

The communications system 700 may be configured to process and transfer e-mails with compressed embedded object data 630 and compressed attachments 640 by, for example, including in the e-mail client system 705 a conventional e-mail application (e.g., Microsoft Outlook), a graphical editor application with compression capabilities (e.g., Adobe Photoshop), and a compression/decompression utility (e.g., WinZip or PKZip/PKUnzip).

The user of the client system 705 may generate and compress graphics data by using the graphics editor application. The user may use the conventional e-mail application to embed the compressed graphics data into an e-mail as compressed embedded object data 630. The user also may use the conventional e-mail application to display any compressed embedded object data 630 received in an e-mail (including graphical objects stored in JPEG or GIF formats).

The user of the client system 705 may compress the attachments 540 by using the compression/decompression utility. The user may upload, send, and download compressed attachments 640 using the conventional e-mail application. The user may decompress downloaded compressed attachments 640 by using the compression/decompression utility.

The communications system 700 also may be configured to process and transfer e-mails with compressed bodies 620. Processing and transferring e-mails with compressed bodies 620, however, typically require both the e-mail client system 705 and the e-mail host system 710 to perform additional functions.

For instance, the e-mail client system 705 may perform the following additional functions: (1) compress the e-mail body 520 prior to mailing, (2) detect when an e-mail with a compressed e-mail body 620 is received by the client system 705, and (3) decompress any received compressed e-mail body 620 prior to displaying the e-mail body 520 to the user.

Correspondingly, the e-mail host system 710 may perform the following additional functions: (1) detect when the host system 710 receives a compressed e-mail body 620, (2) decompress a received compressed e-mail body 620, (3) detect when the client system 705 and/or another host system has the capability of processing e-mails with compressed e-mail bodies 620, and (4) selectively compress the bodies 520 of e-mails sent to client systems 705 or other host systems capable of processing e-mails with compressed e-mail bodies 620.

Figure 8:
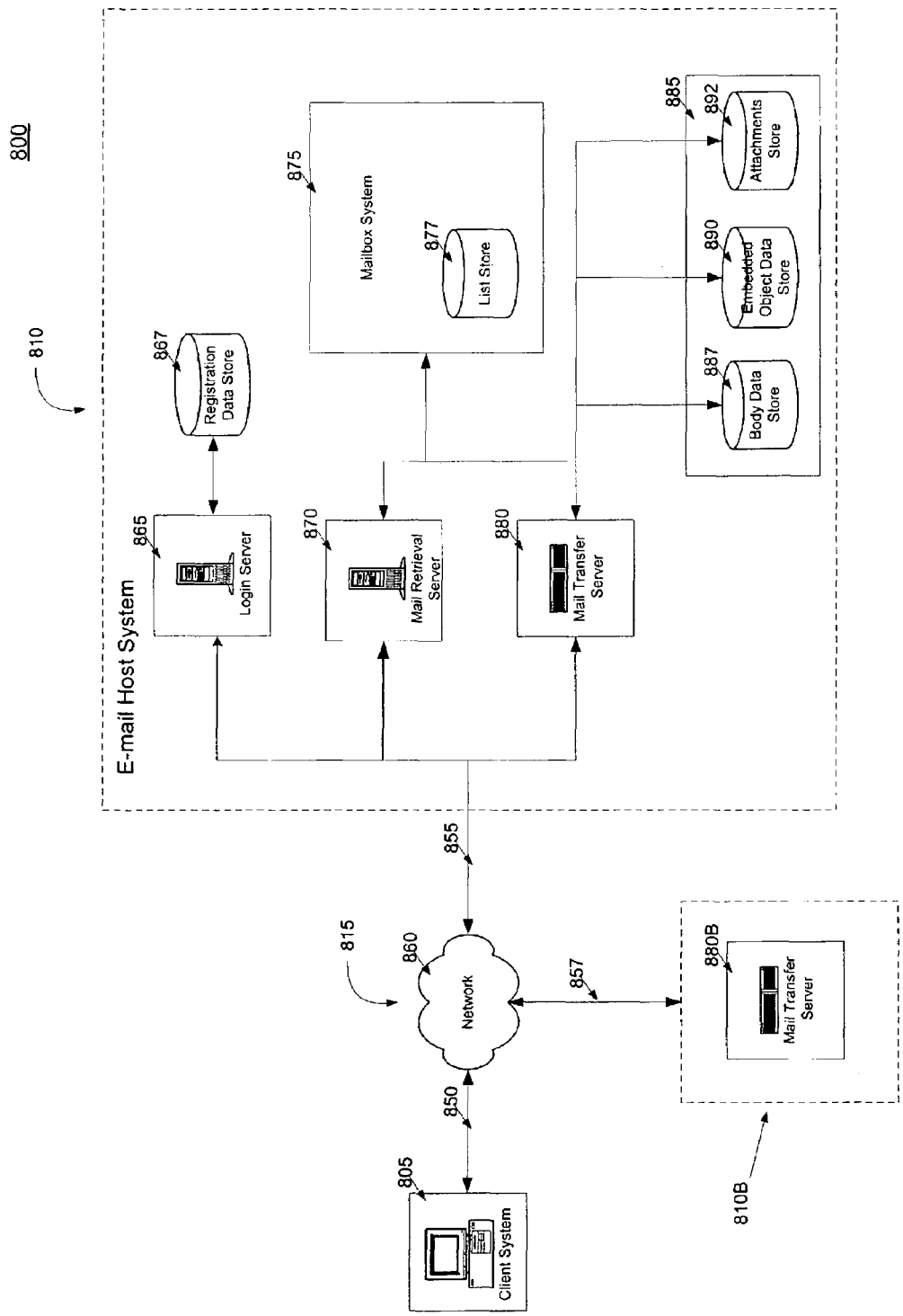
FIG. 8 is a block diagram of an exemplary implementation of the e-mail communications system of FIG. 7 configured to process and transfer e-mails with compressed bodies.

FIG. 8 shows one implementation 800 of the e-mail communications system 700 of FIG. 7 configured to process and transfer e-mails with compressed e-mail bodies. E-mail communications systems may be implemented in a wide variety of ways, and the details and specificity of this implementation is for illustrative purposes only and not meant to be limiting. The same functionality may be achieved in a variety of different ways. Furthermore, while the implementation 800 is directed to processing and transferring e-mails with compressed e-mail bodies, a similar system applying the same general principles may be implemented to process and transfer e-mails with other compressed portions (e.g., attachments or embedded object data).

The exemplary implementation of an e-mail communications system 800 configured to process and transfer e-mails with compressed e-mail bodies includes an e-mail client system 805 communicating with an e-mail host system 810 through a communications link 815. Another e-mail host system 810B also communicates with host 810 and client system 805 through communications link 815. The communications link 815 may include communications pathways 850, 855, and 857 that enable communications through one or more delivery networks 860. The e-mail client system 805, the communications link 815, the communication pathways 850, 855, and 857, and the delivery networks 860 have attributes comparable to those described with respect to the e-mail client system 705, the communications link 715, the communication pathways 750 and 755, and the delivery networks 760 of FIG. 7.

The e-mail host system 810 may include a login server 865 that accesses a registration data store 867, a mail retrieval server 870, a mailbox system 875, a mail transfer server 880, and a mail data store 885. The mailbox system 875 includes a list store 877. The mail data store 885 includes a body data store 887, an embedded objects data store 890, and an attachment data store 892.

The login server 865 verifies the identity of a user prior to allowing the user access to the e-mail services offered by the e-mail host system 810. The login server 865 accesses the registration data store 867 to determine whether a given user attempting to access e-mail services has, in fact, been registered for such services. The login server 865 prevents any users that have not been registered for e-mail services from accessing the e-mail services provided by the e-mail host system 810. The login server 865 also may detect whether the e-mail application of the e-mail client system 805 is able to process and transfer e-mails with compressed bodies.

The mail retrieval server 870 is configured to retrieve e-mails stored in the mail data store 885. The mail retrieval server 870 communicates with the e-mail client system 805 using a protocol for retrieving e-mails such as, for example, Internet Message Access Protocol (IMAP) or Post Office Protocol (POP). The mail retrieval server 870 may receive from the mailbox system 875 a list of the e-mails stored in the mail data store 885 that are available for retrieval. The mail retrieval server 870 may be, for example, a POP or IMAP server.

The mail retrieval server 870 may determine whether the e-mail client system 805 is able to process e-mails with compressed bodies by communicating with the login server 865 or, alternatively or additionally, by communicating directly with the client system 805. If the client system 805 is able to process e-mails with compressed e-mail bodies, the mail retrieval server 870 may automatically compress the body 520 of any e-mails requested for retrieval by the client system 805.

The mailbox system 875 keeps track of information about the e-mails stored in the electronic mailbox of each registered user (i.e., storage area in which the e-mails of each user are stored). The mailbox system stores this information in the list store 877. The list store 877 is a data store that may include a data entry for each e-mail in the mailbox of each user. The data entry for each e-mail may include the header information 510 of the e-mail, the e-mail status information (e.g., message read or not read), and e-mail data storage pointer information. The e-mail data storage pointer information may include one or more pointers to the locations in the mail data store 885 in which the e-mail body 520, the embedded object data 530, and the attachments 540 of the given e-mail are stored. The list store 877 may also store other information related to the mailbox of each user, such as, for example, the size and remaining capacity of the mailbox.

The mail transfer server 880 provides the e-mail client system 805 with the ability to receive e-mails from and send e-mails to other users. The mail transfer server 880 communicates with the e-mail client system 805 using a protocol for transferring e-mails such as, for example, Simple Mail Transfer Protocol (SMTP).

The mail transfer server 880 receives e-mails sent by the client system 805. If the recipient of an e-mail sent by the client system 805 is registered for e-mail services with the e-mail host system 810 (i.e., the e-mail is addressed to a mailbox in the e-mail host system 810), the mail transfer server 880 may store the e-mail in the mailbox of the recipient. If the recipient of an e-mail is not registered for e-mail services with the e-mail host system 810 but is receiving e-mail services from a second and different e-mail host system in communication with the host system 810 through the one or more delivery networks 860, the mail transfer server 880 may send the e-mail to the mail transfer server 880B or equivalent in the second e-mail host system 8101B associated with the recipient.

The mail transfer server 880 also receives e-mails from mail transfer servers 880B of other e-mail host systems 810B addressed to a recipient receiving e-mail services from the e-mail host system 810. The mail transfer server 880 may store the e-mails in the mailbox of the recipient. The mail transfer servers may be, for example, SMTP gateways.

When the mail transfer server 880 receives an e-mail addressed to a recipient who is registered with the e-mail host system 810, the mail transfer server 880 may communicate with the mailbox system 875 to determine whether the mailbox of the recipient is valid and whether the mailbox is full. If the mailbox of the recipient is valid and is not full, the mail transfer server 880 stores the e-mail in the mail data store 885 and accordingly updates the data entries in the list store 877 to reflect the arrival of a new e-mail in the mailbox of the recipient. If the mailbox of the recipient is not valid or is full, the mail transfer server 880 typically sends or bounces the e-mail back to the sender with an appropriate error message.

Prior to storage of the received e-mail in the mail data store 885, however, the mail transfer server 880 may determine whether the body 520 of the received e-mail addressed to a recipient receiving e-mail services from the e-mail host system 810 is compressed. If the received e-mail was sent by the client system 805, the mail transfer server 880 may make this determination by, for example, examining a lookup table, examining the e-mail body itself, communicating with the login server 865, and/or communicating directly with the client system 805.

If the received e-mail was sent to the mail transfer server 880 by another mail transfer server 880B of another e-mail host system 810B, the mail transfer server 880 may determine whether the body 520 of the received e-mail is compressed by, for example, examining a lookup table, examining the e-mail body itself, being manually provided with information regarding whether the other mail transfer server 880B is configured to compress e-mail bodies (e.g., by a system administrator), and/or by communicating directly with the other mail transfer server 880B.

If the body 520 is compressed, the mail transfer server 880 may decompress the body prior to storage. To conserve storage space, the mail transfer server 880 also may subsequently recompress the e-mail body 520 and compress the embedded object data 530 and the attachments 540 prior to storage.

When the mail transfer server 880 receives an e-mail from the client system 805 that is addressed to a recipient registered with another e-mail host system 810B (i.e., the e-mail is addressed to a mailbox in another e-mail host system), the mail transfer server 880 may leave the body of the e-mail compressed upon determining that the other mail transfer server 880B of the other e-mail host system 810B also supports the same e-mail body compression/decompression. If the other mail transfer server 880B, however, does not support the same e-mail body compression/decompression, the mail transfer server 880 decompresses the body of the e-mail received from the client system 805 prior to sending it to the other mail transfer server 880B. The mail transfer server 880 may, for example, obtain information regarding the compression capability of other mail transfer servers 880B of other e-mail host systems 810B manually and/or through communications directly with the other mail transfer servers 880B.

The mail data store 885 stores e-mail data including the body 520, embedded object data 530, and attachments of e-mails received by users registered to receive e-mail services provided by the host system 810. The mail data store 885 may include a body data store 887, an embedded object data store 890, and an attachments data store 892. The mail data store 885 sends e-mail data to the mail retrieval server 870 and receives e-mail data for storage from the mail transfer server 880. The e-mail data, which typically is compressed when stored, is typically decompressed by the mail data store 885 or the mail retrieval server 870 upon being retrieved. The mail data store 885 also may provide the mailbox system 875 and/or the mail transfer server 880 with e-mail data storage pointer information.

A user of the client system 805 typically is registered prior to accessing the e-mail services provided by the e-mail host system 810. The registration process includes generating a user configuration file for the user. The configuration file includes a unique identifier such as, for example, an e-mail address or a screen name. The configuration file also may include a password that must be provided by the user each time the user wants to access the e-mail services provided by the host system 810. The user configuration files may be stored in the registration data store 877.

When a user wants to access the e-mail services provided by the e-mail host system 810, the user launches or executes an e-mail application that communicates with the login server 865. The user may log into the host system 810 by providing his or her unique identifier and his or her password. The login server 865 verifies that the unique identifier and associated password correspond to a unique identifier and associated password stored in the registration data store and registered to receive e-mail services.

The login server 865 may communicate with the e-mail application of the client system 810 to determine whether the e-mail application is configured to process and transfer e-mails with compressed bodies. Once this determination is made, the login server 865 may modify a temporary login file or the user configuration file to reflect the ability of the current client system 805 to process and transfer e-mails with compressed bodies. The temporary login file or the user configuration file may be modified accordingly by, for example, setting a flag. Since the user may log into the host system 810 at a later time using a different client system 805, the flag may be reset each time the user logs into the host system 810 or to reflect the identity of the user machine associated with the stored configuration.

FIGS. 9–12 illustrate processes that enable the e-mail communications system 800 to handle and process e-mails with compressed bodies. FIGS. 9–12 are a specific implementation of FIGS. 3A–B and 4A–B tailored towards e-mails and the e-mail communications system 800 in particular. The processes illustrated in FIGS. 9–12 are not meant to be limiting as the specific operations of e-mails systems may vary significantly along with the variations in e-mail system configurations.

Figure 9:
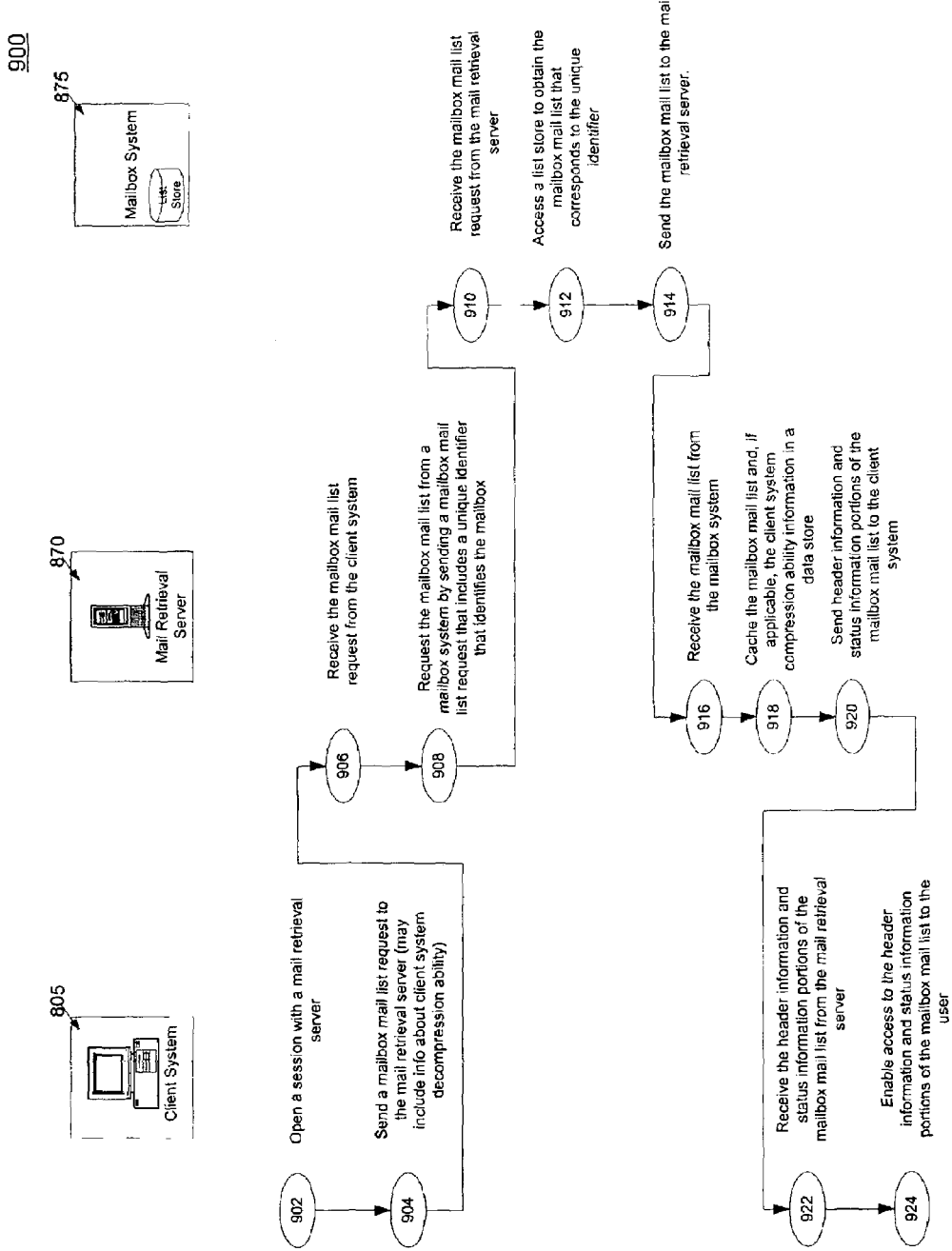
FIG. 9 is a flow diagram of a process for enabling a user to perceive a list of e-mails, including e-mails with compressed bodies.

Referring to FIG. 9, a process 900 for enabling a user to perceive a list of e-mails sent to the user includes the client system 805 opening a session with the mail retrieval server 870 (902) and sending a mailbox mail list request to the mail retrieval server 870 (904). The mailbox mail list request may include information about the ability of the client system 805 to decompress the body of e-mails. The mailbox mail list request also may include the unique identifier of the user.

The mail retrieval server 870 receives the mailbox mail list request from the client system 805 (906) and requests the mailbox mail list from the mailbox system 875 (908). The mail retrieval server 870 may receive the unique identifier of the user from either the login server 865 or from the client system 805. The mailbox mail list request typically includes the unique identifier of the user.

The mailbox system 875 receives the mailbox mail list request from the mail retrieval server 870 (910), accesses the list store 877 to obtain the mailbox mail list that corresponds to the unique identifier (912), and sends the mailbox mail list to the mail retrieval server 870 (914). The mailbox mail list includes some or all of the data entries corresponding to e-mails stored in the mailbox of the user. The data entries for each e-mail include header information, status information, and data storage pointer information.

The mail retrieval server 870 receives the inbox mail list from the mailbox system 875 (916), caches the inbox mail list and, if applicable, caches any information that the mail retrieval server 870 may have received about the ability of the client system 805 to decompress the body of e-mails (918). The mail retrieval server 870 sends the header information and the status information of the data entries of the mailbox mail list to the client system 805 (920).

The client system 805 receives the header information and the status information of the data entries in the mailbox mail list from the mail retrieval server 870 (922) and enables the user of the client system 805 to access the header and status information of the data entries in the mailbox mail list (924). The e-mail application of the client system 805 may, for example, allow the user to access the header and status information of the mailbox mail list by displaying the information in a list on a computer screen. The user of the client system 805 may thus perceive the list of e-mails sent to the user by simply viewing the computer screen.

Figure 10:
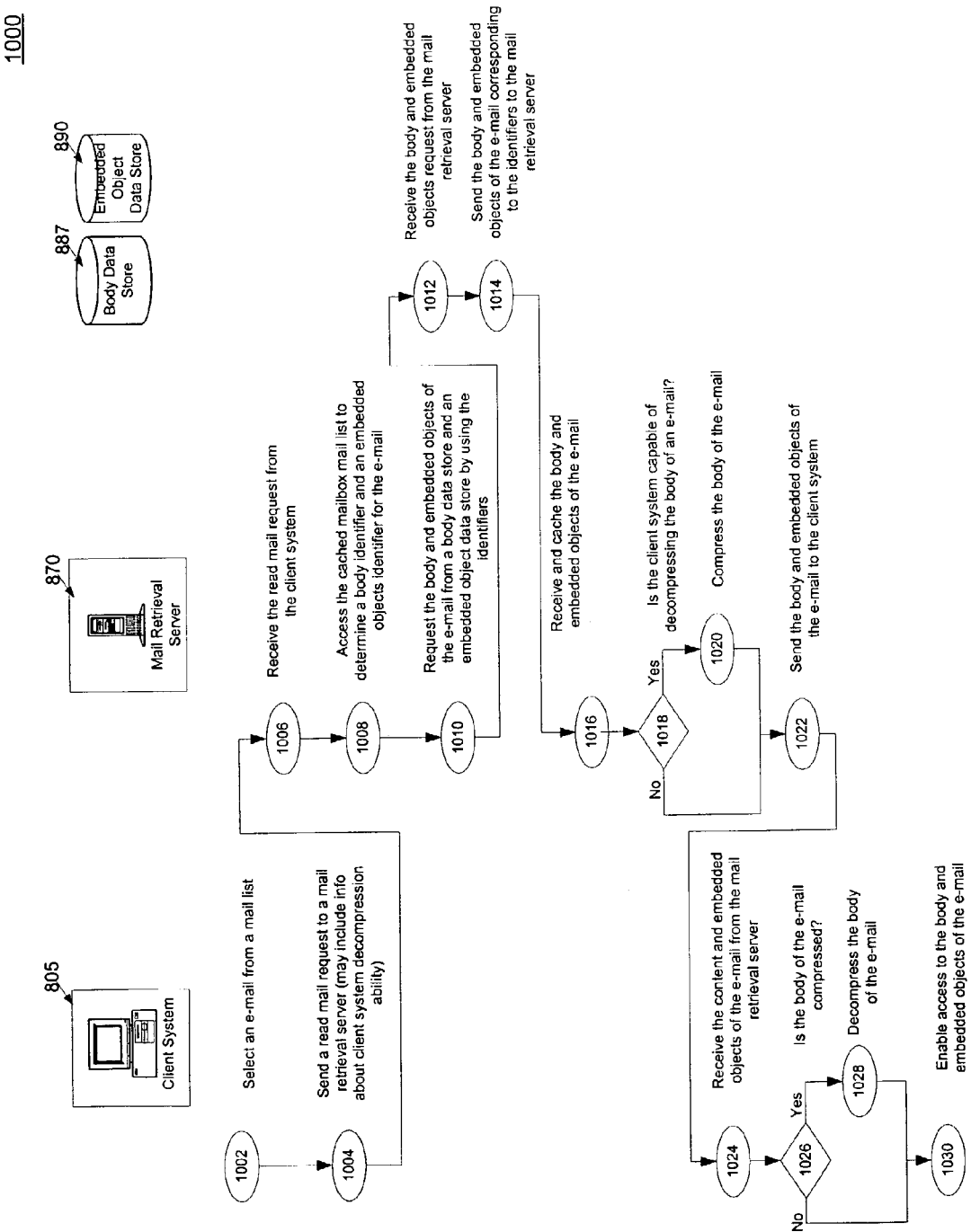
FIG. 10 is a flow diagram of a process for enabling a user to access an e-mail with a compressed body.

Referring to FIG. 10, a process 1000 for enabling a user to access an e-mail with a compressed body includes the client system 805 enabling the user to select an e-mail from a mailbox mail list (1002) and sending a read mail request to the mail retrieval server 870 (1004). The read mail request may include information about the ability of the client system 805 to decompress the body of e-mails.

The mail retrieval server 870 receives the read mail request from the client system 805 (1006) and accesses the cached mailbox mail list to retrieve the data storage pointers that point to the locations in the mail data store 885 of the body and the embedded object data of the selected e-mail (1008). The mail retrieval server 870 requests the body data from the body data store 887 and the embedded object data from the embedded object data store 890 using the data storage pointers (1010).

The body data store 887 and the embedded object data store 890 receive the body data and embedded object data requests (1012) and send the body data and embedded object data of the e-mail corresponding to the respective data storage pointers to the mail retrieval server 870 (1014). The mail retrieval server 870 receives and caches the body data and the embedded object data (1016).

The mail retrieval server 870 determines whether the client system 805 is capable of decompressing the body of an e-mail (1018). The mail retrieval server 870 may obtain information about the e-mail body decompression ability of the client system 805 in a variety of different ways. For example, the client system 805 may include this information with the read email request sent to the mail retrieval server 870. The mail retrieval server 870 also may obtain and cache this information during retrieval of the mailbox list information in accordance with process 900. The mail retrieval server 870 also may directly request this information from the client system 805 or from the login server 875.

The mail retrieval server 870 compresses the body of the selected piece of e-mail if the mail retrieval server 870 determines that the client system 805 is able to decompress the body of an e-mail (1020). The body and embedded objects of the selected e-mail are then sent to the client system (1022).

The client system 805 receives the body data and embedded object data of the e-mail from the mail retrieval server 870 (1024). The client system 805 determines if the body of the received e-mail is compressed (1026) by, for example, examining the e-mail body itself or communicating with the mail retrieval server 870. If the received e-mail body data is compressed, the client system 805 decompresses the body data (1028) prior to enabling a user of the client system 805 to access the body data and the embedded object data of the selected e-mail (1030).

The e-mail application of the client system 805 may, for example, allow the user to access the body data and the embedded object data of the selected e-mail by displaying the body and the embedded objects of the e-mail on a computer screen. The user of the client system 805 may thus read the message text and view any embedded graphics in the selected e-mail.

Figure 11:
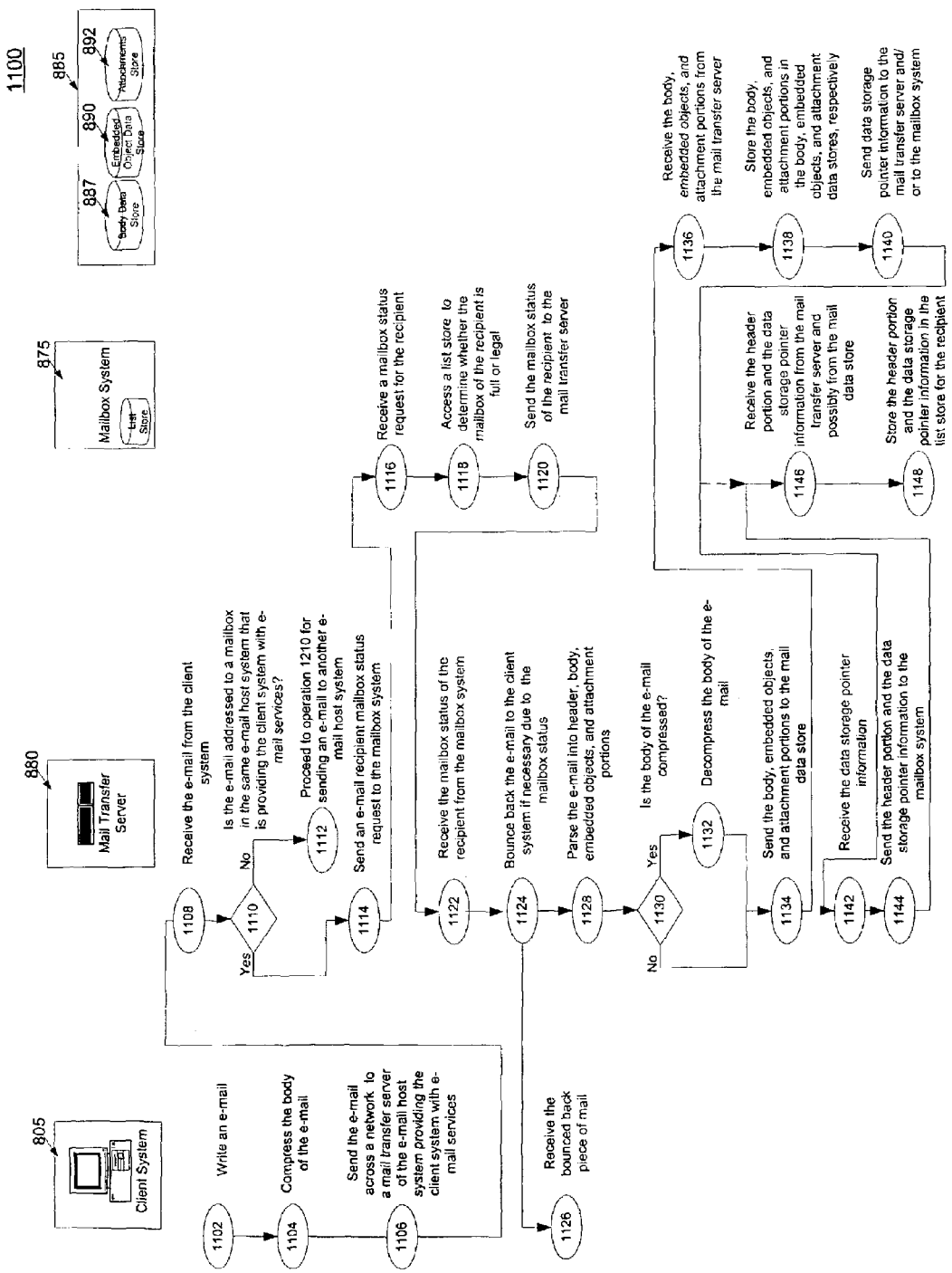
FIG. 11 is a flow diagram of a process for enabling a user to send an e-mail with a compressed body to a recipient having a mailbox in the same e-mail host system as that used by the sender.

Referring to FIG. 11, a process 1100 for enabling a user to send an e-mail with a compressed body to a recipient having a mailbox in the same e-mail host system 810 as that used by the sender includes the client system 805 enabling the user to input or "write" an e-mail (1102), compressing the body of the e-mail (1104), and sending the e-mail across the one or more delivery networks 860 to the mail transfer server 880 of the host system 810 of the sender (1106). The mail transfer server 880 receives the e-mail from the client system 805 (1108).

The mail transfer server 880 inspects the header 510 to determine if the e-mail is addressed to a mailbox in the host system 810 (1110). If the mail transfer server 880 determines that the e-mail is addressed to a recipient having a mailbox in another e-mail host system 810B connected to the e-mail host system 810 through a delivery network 860, then the mail transfer server 880 proceeds to process 1200 discussed next (1112). If the e-mail is addressed to a mailbox in the host system 810, the mail transfer server 880 sends a status request to the mailbox system 875 to determine the status of the mailbox of the recipient (1114).

The mailbox system 875 receives the mailbox status request from the mail transfer server 880 (1116) and accesses the list store 877 to determine whether the mailbox of the recipient is full or legal (1118). The mailbox system 875 returns the mailbox status of the recipient to the mail transfer server 880 (1120).

The mail transfer server 880 receives the status of the mailbox of the recipient (1122) and bounces back (i.e., returns to the sender) the e-mail if necessary due to the mailbox status of the recipient (1124). For example, if the mailbox of the recipient is full or if the mailbox of the recipient is no longer legal (e.g., the mailbox has been frozen because of the behavior of the recipient), the e-mail is bounced back. When the mail transfer server 880 bounces back an e-mail, the mail transfer server 880 changes the recipient address to that of the sender, optionally adds information regarding the reason why the e-mail is being bounced back, and handles the e-mail like any other e-mail that is sent to the client system (1126). If the mailbox of the recipient is legal and is not full, the mail transfer server 880 parses the e-mail into header, body, embedded object, and attachment portions (1128).

The mail transfer server 880 determines whether the body of the e-mail is compressed (1130). The mail transfer server 880 may make this determination by, for example, examining the e-mail body itself, communicating with the login server 865, and/or communicating directly with the client system 805. If the body of the e-mail is compressed, the mail transfer server 880 decompresses the body of the e-mail (1132).

The mail transfer server 880 sends the body, embedded objects, and attachment portions of the e-mail to the mail data store 885 (1134 and 1136). The mail transfer server 880 may compress the body, the embedded objects, and the attachment portions of the e-mail before sending them to the mail data store 885. Alternatively or additionally, the mail data store 885 may compress the body, the embedded objects, and the attachment portions of the e-mail before storage.

The body, the embedded objects, and the attachment portions of the e-mail are stored in the body data store 887, the embedded object data store 890, and the attachments store 892 (1138). The mail data store 885 sends data storage pointer information to the mail transfer server 880 and/or to the mailbox system 875 (1140).

The mail transfer server 880 may receive the data storage pointer information from the mail data store 885 (1142) and may send the data storage pointer information to the mailbox system 875 (1144). The mail transfer server 880 sends the header portion of the e-mail to the mailbox system 875 (1144).

The mailbox system 875 receives the header portion from the mail transfer server 880 and receives the data storage pointer information from the mail transfer server 880 and/or from the mail data store 885 (1146). The mailbox system 875 stores the header portion and the data storage pointer information in the list store 377 in an e-mail data entry corresponding to the mailbox of the recipient (1148).

FIG. 12 illustrates a process 1200 for enabling a user to send an e-mail with a compressed body to a recipient having a mailbox in an e-mail host system 810B different from that used by the sender. The process 1200 includes having the client system 805 enable the user to input or "write" an e-mail (1202), compressing the body of the e-mail (1204), and sending the e-mail across the one or more delivery networks 860 to the mail transfer server 880 of the host system 810 of the sender (1206). The mail transfer server 880 receives the e-mail from the client system 805 (1208).

The mail transfer server 880 inspects the header 510 to determine if the e-mail is addressed to a mailbox in the host system 810 (1210). If the e-mail is addressed to a mailbox in the host system 810, the mail transfer server 880 proceeds to process 1100 as discussed previously (1212). If the mail transfer server 880 inspects the header 510 of the e-mail and determines that the e-mail is addressed to a recipient having a mailbox in another e-mail host system 810B connected to the e-mail host system 810 through a delivery network 860, then the mail transfer server 880 determines whether the mail transfer server 880B of the other e-mail host system supports the compression and decompression of e-mail bodies (1214).

The mail transfer server 880 may determine whether the mail transfer server 880B supports compression and decompression of e-mail bodies in a variety of different ways. For example, the mail transfer server 880 may be manually provided with information regarding the compression capability of the other mail transfer server 880B by a system administrator, may obtain this information through direct communication with the mail transfer server 880B, or by referencing a lookup table.

If the mail transfer server 880B supports the same compression format as used by the client system 805 to compress the body of the e-mail, the mail transfer server 880 sends the e-mail with the compressed body directly to the mail transfer server 880B (1216). If the mail transfer server 880B supports a different compression format than that used by the client system 805, the mail transfer server 880 may decompress the body of the e-mail and recompress the body of the e-mail in a format compatible with that used by the mail transfer server 880B. Such an operation assumes that the mail transfer server 880 supports multiple e-mail body compression formats.

The mail transfer server 880B receives the e-mail with the compressed body (1218) and places the e-mail in the mailbox of the recipient (1220). The operations used to place the e-mail in the mailbox of the recipient may be the same as or functionally similar to operations 1114–1148 of process 1100.

If the mail transfer server 880B does not support e-mail body compression or does not support e-mail body compression using a compression format supported by the mail transfer server 880, the mail transfer server 880 decompresses the body of the e-mail (1222) and sends the e-mail with the decompressed body to the mail transfer server 880B of the recipient (1224). The mail transfer server 880B receives the e-mail with the decompressed body (1226) and places the e-mail in the mailbox of the recipient (1228) by performing typical e-mail processing operations.

A number of implementations have been described. Nevertheless, it will be understood that various modifications may be made. For example, the computer systems exchanging communications as described with respect to FIGS. 1, 2, 7, and 8 may be one or more local and remote computer systems rather than client and host computer systems.

While processes 1100 and 1200 enable a user to send an e-mail with a compressed body to a single recipient, similar processes may be used to enable a user to send an e-mail with a compressed body to multiple recipients. In process 1200, mail transfer server 880 may instead receive an e-mail with an uncompressed body from the client system 805 and may subsequently compress the body of the e-mail upon determining that the mail transfer server 880B supports compression. Accordingly, other implementations are within the scope of the following claims.

What is claimed is:

1. A computer system comprising:
    an access module configured to access an e-mail, which e-mail includes a header and a body and is capable of supporting attachments to the e-mail that are distinct of the body of the e-mail;
    a detection processing module configured to determine whether a remote system associated with the destination of the e-mail is capable of decompressing less than all of the e-mail, wherein decompressing less than all includes decompressing a compressed body of the e-mail;
    a compression processing module configured to compress less than all of the e-mail, wherein compressing less than all includes compressing the body of the e-mail conditioned on whether the remote system is determined capable of decompressing the compressed body;
    a message generator module configured to generate a compressed e-mail message that includes a header and a body and is capable of supporting attachments distinct from the body, wherein the body comprises the compressed body of the accessed e-mail; and
    a communication processing module configured to communicate to the remote system the compressed e-mail message.

2. The system of claim 1 wherein the e-mail includes encoded text.

3. The system of claim 1 wherein the compression is lossless.

4. The system of claim 1 wherein the compression processing module uses a Zlib compression scheme.

5. The system of claim 1 wherein the body of the e-mail includes content written in hypertext markup language.

6. The method of claim 1 wherein the compression processing module is configured to maintain the header of the e-mail in an uncompressed format.

7. The method of claim 1 wherein the e-mail supports one or more attachments and the compression processing module is configured to compress the body of the e-mail and compress the one or more attachments if the remote system is determined capable of decompressing.

8. The method of claim 1 wherein the e-mail includes an image embedded in the e-mail and the compression processing module is configured to compress the body of the e-mail and compress the image embedded in the e-mail if the remote system is determined capable of decompressing.

9. The system of claim 8 wherein the communication processing module also is configured to send the compressed image embedded in the e-mail to the remote system.

10. The method of claim 1 wherein the communication processing module is configured to communicate the header, the compressed e-mail body, and at least one attachment to the e-mail as a compressed e-mail message that includes a header, a body, and at least one attachment, wherein the header of the compressed e-mail message comprises the header of the e-mail, the body of the compressed e-mail message comprises the compressed body of the e-mail, and the at least one attachment of the compressed e-mail message comprises the at least one attachment of the e-mail.

11. The system of claim 1, wherein the detection processing module is configured to determine whether a remote system is capable of decompressing the compressed body of the e-mail without decompressing the header of the e-mail.

12. The system of claim 11, wherein the header of the e-mail comprises at least one of:
    the name or address of the sender of the e-mail,
    the name or address of the recipient of the e-mail,
    a date and a time the e-mail was sent, and
    a subject to which the e-mail relates.

13. A computer-implemented method for communicating an e-mail, the method comprising:
    accessing an e-mail, which e-mail includes a header and a body and is capable of supporting attachments to the e-mail that are distinct of the body of the e-mail;
    determining whether a remote system associated with the destination of the e-mail is capable of decompressing less than all of the e-mail, wherein decompressing less than all includes decompressing a compressed body of the e-mail;

compressing less than all of the e-mail, wherein compressing less than all includes compressing the body of the e-mail if the remote system is determined capable of decompressing the compressed body generating a compressed e-mail message that includes a header and a body and is capable of supporting attachments distinct from the body, wherein the body comprises the compressed body of the accessed e-mail; and communicating to the remote system the compressed e-mail message.

14. The method of claim 13 providing the e-mail includes encoded text.

15. The method of claim 13 wherein compressing less than all comprises compressing a portion without any data loss.

16. The method of claim 15 wherein compressing less than all without any data loss comprises compressing a portion using Zlib compression format.

17. The method of claim 13 providing the email body includes content written in hypertext markup language.

18. The method of claim 13 wherein compressing less than all of the e-mail includes maintaining the header of the e-mail in an uncompressed format.

19. The method of claim 13 wherein the e-mail supports one or more attachments and compressing less than all of the e-mail includes compressing the body of the e-mail and compressing the one or more attachments if the remote system is determined capable of decompressing.

20. The method of claim 13 wherein the e-mail includes an image embedded in the e-mail and compressing less than all of the e-mail includes compressing the body of the e-mail and compressing the image embedded in the e-mail if the remote system is determined capable of decompressing.

21. The method of claim 20 further comprising sending the compressed image embedded in the e-mail to the remote system.

22. The method of claim 13 wherein communicating to the remote system includes communicating the header, the compressed e-mail body, and at least one attachment to the e-mail as a compressed e-mail message that includes a header, a body, and at least one attachment, wherein the header of the compressed e-mail message comprises the header of the e-mail, the body of the compressed e-mail message comprises the compressed body of the e-mail, and the at least one attachment of the compressed e-mail message comprises the at least one attachment of the e-mail.

23. The method of claim 13, wherein determining whether the remote system associated with the destination of the e-mail is capable of decompressing less than all of the e-mail comprises determining whether the remote system is capable of decompressing the compressed body of the e-mail without decompressing the header of the e-mail.

24. The method of claim 23, wherein the header of the e-mail comprises at least one of:
the name or address of the sender of the e-mail,
the name or address of the recipient of the e-mail,
a date and a time the e-mail was sent, and
a subject to which the e-mail relates.

25. A computer system comprising:
a communication processing module configured to receive a compressed e-mail message from a remote system, wherein the compressed e-mail message includes a header and a body and is capable of supporting attachments that are distinct of the body of the compressed e-mail message, and wherein the body of the compressed e-mail message comprises the compressed body of an e-mail and the header of the compressed e-mail message comprises the header of the e-mail;

a detection processing module configured to determine whether a remote system associated with the origin of the compressed e-mail message is capable of compressing less than all of the e-mail, wherein compressing less than all includes compressing a body of the e-mail; and a compression processing module configured to decompress the compressed body of the e-mail if the remote system is determined capable of compressing the body.

26. The system of claim 25 wherein the compressed e-mail message includes encoded text.

27. The system of claim 26 wherein the compression is lossless.

28. The system of claim 25 wherein the compression processing module uses a Zlib compression scheme.

29. The system of claim 25 wherein the body of the e-mail includes content written in hypertext markup language.

30. The method of claim 25 wherein the communication processing module is configured to receive a compressed e-mail message that includes a header maintained in an uncompressed format.

31. The method of claim 25 wherein the compressed e-mail message supports one or more compressed attachments and the compression processing module is configured to decompress the compressed one or more attachments if the remote system is determined capable of compressing.

32. The method of claim 25 wherein the compressed e-mail message includes a compressed image embedded in the e-mail and the compression processing module is configured to decompress the compressed image if the remote system is determined capable of compressing.

33. The system of claim 32 wherein the communication processing module also is configured to receive the compressed image embedded in the e-mail from the remote system.

34. The method of claim 25 wherein the communication processing module is configured to receive a compressed e-mail message that includes the header, the body and at least one attachment, wherein the header of the compressed e-mail message comprises the header of the e-mail, the body of the compressed e-mail message comprises the compressed body of the e-mail, and the at least one attachment of the compressed e-mail message comprises at least one attachment of the e-mail.

35. The system of claim 25, wherein the detection processing module is configured to determine whether a remote system is capable of compressing the body of the e-mail without compressing the header of the e-mail.

36. The system of claim 35, wherein the header of the e-mail comprises at least one of:
the name or address of the sender of the e-mail,
the name or address of the recipient of the e-mail,
a date and a time the e-mail was sent, and
a subject to which the e-mail relates.

37. A computer-implemented method comprising:
receiving a compressed e-mail message from a remote system, wherein the compressed e-mail message includes a header and a body and is capable of supporting attachments that are distinct of the body of the compressed e-mail message, and wherein the body of the compressed e-mail message comprises the compressed body of an e-mail and the header of the compressed e-mail message comprises the header of the e-mail;

determining whether a remote system associated with the origin of the compressed e-mail message is capable of compressing less than all of the e-mail, wherein compressing less than all includes compressing a body of the e-mail;

and decompressing the compressed body of the e-mail if the remote system is determined capable of compressing the body.

38. The method of claim 37 providing the compressed e-mail message includes encoded text.

39. The method of claim 37 wherein decompressing the compressed body comprises decompressing the compressed body without any data loss.

40. The method of claim 39 wherein decompressing the compressed body without any data loss comprises decompressing the compressed body using Zlib compression format.

41. The method of claim 37 providing the email body includes content written in hypertext markup language.

42. The method of claim 37 wherein receiving a compressed e-mail message includes receiving a compressed e-mail message that includes a header maintained in an uncompressed format.

43. The method of claim 37 wherein the compressed e-mail message supports one or more compressed attachments and further comprising decompressing the compressed one or more attachments if the remote system is determined capable of compressing.

44. The method of claim 37 wherein the compressed e-mail message includes a compressed image embedded in the e-mail and further comprising decompressing the compressed image if the remote system is determined capable of compressing.

45. The method of claim 44 further comprising receiving the compressed image embedded in the e-mail from the remote computer.

46. The method of claim 37 wherein receiving a compressed e-mail message includes receiving a compressed e-mail message that includes the header, the body and at least one attachment, wherein the header of the compressed e-mail message comprises the header of the e-mail, the body of the compressed e-mail message comprises the compressed body of the e-mail, and the at least one attachment of the compressed e-mail message comprises at least one attachment of the e-mail.

47. The method of claim 37, wherein determining whether the remote system associated with the origin of the e-mail is capable of compressing less than all of the e-mail comprises determining whether the remote system is capable of compressing the body of the e-mail without compressing the header of the e-mail.

48. The method of claim 47, wherein the header of the e-mail comprises at least one of:
the name or address of the sender of the e-mail,
the name or address of the recipient of the e-mail,
a date and a time the e-mail was sent, and
a subject to which the e-mail relates.

* * * * *